United States Patent [19]

Hazuki

[11] Patent Number: 4,670,967

[45] Date of Patent: Jun. 9, 1987

[54] FORMING MULTILAYER INTERCONNECTIONS FOR A SEMICONDUCTOR DEVICE BY VAPOR PHASE GROWTH PROCESS

[75] Inventor: Yoshikazu Hazuki, Tokyo, Japan

[73] Assignee: Kabushiki Kaisha Toshiba, Kawasaki, Japan

[21] Appl. No.: 685,836

[22] Filed: Dec. 24, 1984

[30] Foreign Application Priority Data

Dec. 27, 1983 [JP] Japan ................. 58-246316

[51] Int. Cl.⁴ ................ H01L 21/428; H01L 21/443
[52] U.S. Cl. .................................. 29/576 B; 29/591; 148/DIG. 19; 148/DIG. 26; 427/91
[58] Field of Search ............... 29/571, 578, 576 B, 29/589, 591, 847; 148/1.5, DIG. 19, DIG. 46, DIG. 26, DIG. 93, DIG. 147; 427/88, 89, 91

[56] References Cited

U.S. PATENT DOCUMENTS

| | | | |
|---|---|---|---|
| 3,366,519 | 1/1968 | Pritchard et al. | 29/847 X |
| 3,801,365 | 4/1974 | Hrzek | 148/DIG. 147 X |
| 4,272,561 | 6/1981 | Rothman et al. | 427/89 X |
| 4,293,637 | 10/1981 | Hatada et al. | 427/89 X |
| 4,330,931 | 5/1982 | Liu | 29/571 |
| 4,353,935 | 10/1982 | Symersky | 427/89 |
| 4,377,438 | 3/1983 | Moriya et al. | 156/646 X |
| 4,403,392 | 9/1983 | Oshima et al. | 29/591 X |
| 4,441,247 | 4/1984 | Gargini et al. | 29/571 |
| 4,462,149 | 7/1984 | Schwabe | 29/591 X |
| 4,476,157 | 10/1984 | Shinozaki | 427/89 X |
| 4,510,670 | 4/1985 | Schwabe et al. | 29/571 |
| 4,520,041 | 5/1985 | Aoyama et al. | 427/88 |
| 4,523,372 | 6/1985 | Balda et al. | 29/591 X |

FOREIGN PATENT DOCUMENTS

| | | | |
|---|---|---|---|
| 0051842 | 5/1981 | Japan | 427/89 |
| 142631 | 7/1981 | Japan | 148/DIG. 46 |
| 57-76833 | 5/1982 | Japan | |

OTHER PUBLICATIONS

Cooke, "A Review of LPCVP Metallization for Semiconductor Devices", Vacuum, vol. 37, No. 2, pp. 67-73, Feb. 1985.

Primary Examiner—Olik Chaudhuri
Attorney, Agent, or Firm—Oblon, Fisher, Spivak, McClelland & Maier

[57] ABSTRACT

A method of forming a multilayer interconnection for a semiconductor device comprising a first insulation layer deposited on a substrate having semiconductor elements, first interconnection patterns, a second insulation layer interposed between the first interconnection patterns, a third insulation layer covering the first interconnection patterns and second interconnection patterns contacted with the first interconnection patterns, wherein the first interconnection patterns are formed in such a manner by vapor phase growth process that the first interconnection patterns cover both edges of the interposed second insulation layer.

12 Claims, 14 Drawing Figures

FORMING MULTILAYER INTERCONNECTIONS FOR A SEMICONDUCTOR DEVICE BY VAPOR PHASE GROWTH PROCESS

BACKGROUND OF THE INVENTION (a) Field of the Invention

This invention relates to a method of forming a multilayer interconnection for a semiconductor device without causing a disconnection.

(b) Description of the Prior Art

FIG. 1 illustrates an example of the conventional semiconductor device provided with a 2-layer interconnection. Reference numeral 1 denotes a silicon substrate on which a semiconductor element is formed. A first aluminium interconnection 3 is formed on said substrate with a $SiO_2$ layer 2 interposed therebetween. Then, said first aluminium interconnection 3 is covered with a $SiO_2$ layer 4. After a hole for connecting interconnections with each other is formed in said $SiO_2$ layer 4, a second aluminium interconnection 5 is formed thereon. The conventional semiconductor-manufacturing device however is accompanied with the drawbacks that if the mismatching of a mask takes place in selectively etching the hole in the $SiO_2$ layer, said hole will be displaced from its prescribed position in the first aluminium interconnection 3; a narrow groove 6 resulting from overetching appears at the end portion of the hole of the first aluminium interconnection 3; the second aluminium interconnection 5 tends to be broken at said narrow groove 6; to avoid the disconnection of the interconnection, it is necessary to apply an interconnection wider than the hole in consideration of the mismatching of a mask pattern facing the hole; and the broadening of the interconnection will present difficulties in elevating the integration degree of semiconductor elements.

SUMMARY OF THE INVENTION

It is accordingly the object of this invention to provide a method of forming a multilayer interconnection for a semiconductor device which reliably suppresses the breakage of the interconnection at a hole without reducing the integration degree of semiconductor elements, thereby elevating its reliability.

To attain the above-mentioned object, this invention provides a method of forming a multilayer interconnection for a semiconductor device which comprises the steps of:

(i) forming a first insulation layer on a substrate having semiconductor elements;

(ii) forming first interconnection patterns with a second insulation layer interposed between said first interconnection patterns in such a manner that said first interconnection patterns cover edge parts of said interposed second insulation layer, respectively;

(iii) forming a third insulation layer at least on said first interconnection patterns;

(iv) forming a hole in said third insulation layer to expose part of said first interconnection pattern; and (v) forming a second interconnection pattern which contacts said first interconnection pattern through said hole, and which overlaps the first interconnection patterns.

DETAILED DESCRIPTION OF THE PREFERRED EMBODIMENTS

Description may now be made with reference to the accompanying drawings of a method of forming multilayer interconnection for a semiconductor substrate according to a first embodiment of this invention.

Figure 2A:
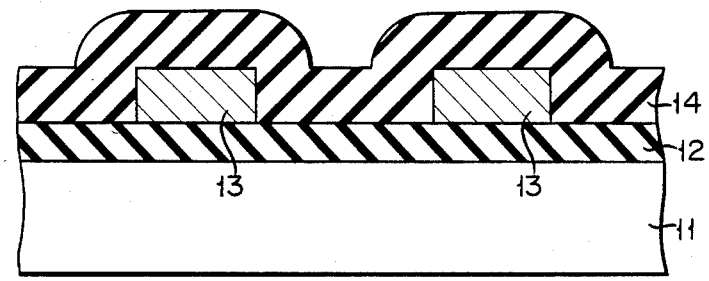
FIGS. 2A to 2F are sectional views indicating one sequential steps of forming multilayer interconnection for a semiconductor device according to a first embodiment of this invention.

FIGS. 2A to 2F are sectional views showing the sequential steps of forming multilayer interconnection for a semiconductor device according to a first embodiment of this invention. First, as shown in FIG. 2A, a first insulation layer prepared from, for example, a silicon oxide layer 12 is deposited by vapor phase growth on a silicon substrate 11 in which a semiconductor element (not shown) is previously formed. Thereafter, holes facing the semiconductor element are formed. First interconnection 13 are formed to cover said holes and silicon oxide layer 12. The first interconnection 13 is obtained by first depositing an aluminium layer with a thickness of less than 0.8 microns by, for example, magnetron sputtering, forming an etching mask on said aluminium layer and patterning said etching mask by the reaction ion etching process (RIE) involving the application of a gaseous mixture consisting of, for example, $CCl_4$ and $Cl_2$. Thereafter, a silicon oxide layer 14 is formed with a thickness of less than 0.8 microns at a temperature of less than 300° C. by the plasma gas phase growth process involving the application of a gaseous mixture consisting of, for example, $SiH_4$ and $N_2O$.

Figure 2B:
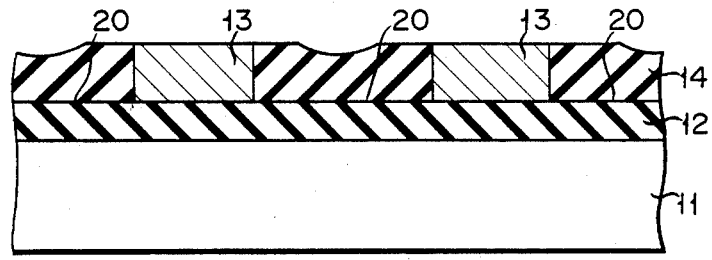

Thereafter, the aforementioned silicon oxide layer 14 is flattened by the insulation layer-flattening process (U.S. Pat. No. 4,377,438) previously proposed by the present inventors which involves the application of the RIE process. This insulation layer-flattening process comprises the steps of depositing a silicon nitride layer with a thickness of about one micron on the silicon oxide layer 14, and etching both silicon oxide layer 14 and said silicon nitride layer by the RIE process involving the application of a gaseous mixture consisting of $CF_4$ and $H_2$ (containing 27% of hydrogen). As a result, the silicon oxide layer 14 is flattened as shown in FIG. 2B, and embedded in the interstices 20 between the first interconnections 13 while the upper portion of said first interconnections 13 is exposed to the outside.

Figure 2C:
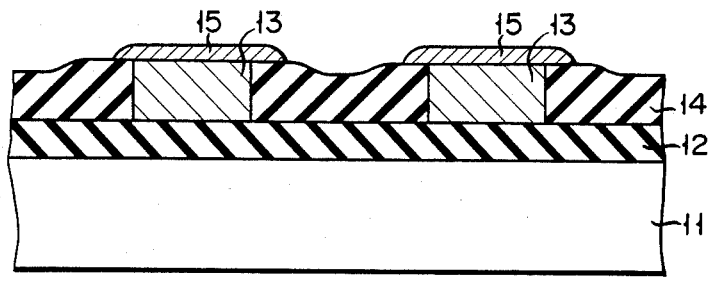

Next as seen from FIG. 2C, a tungsten layer 15 is deposited with a thickness of less than 0.3 micron only on the exposed surface portions of the first interconnections 13 by the vapor phase growth process involving the application of a gaseous mixture consisting of tungsten hexafluoride and $H_2$. The deposition of said tungsten layer 15 is carried out under the following conditions:

Substrate temperature: 250° to 500° C.

React or pressure: $1 \times 10^{-3}$ to 760 Torr

Partial pressure of WF$_6$ gas: $1 \times 10^{-4}$ to $5 \times 10^{-2}$ Torr

Figure 2D:
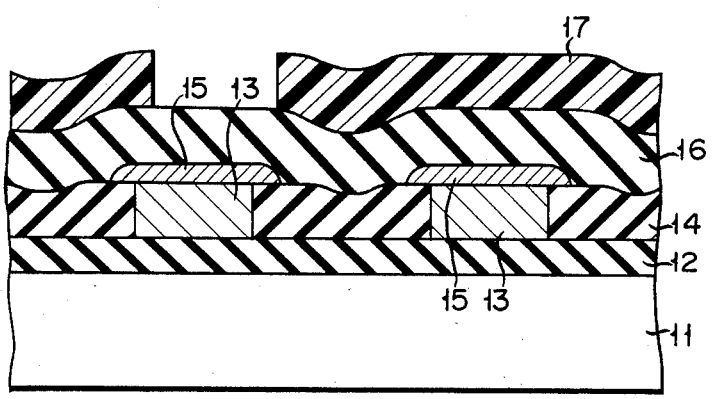

As a result, the tungsten layer 15 is automatically deposited, as shown in FIG. 2C, with a width (for example, 0.1 to 0.2 micron) slightly broader than that of the first interconnection 13. Thereafter as shown in FIG. 2D, a silicon oxide layer 16 is deposited as a third insulation layer with a thickness of less than 0.8 micron by the plasma vapor phase growth process involving the application of a gaseous mixture consisting of SiH$_4$ and N$_2$ as is the case with, for example, the second insulation layer. Thereafter, a photoresist 17 is applied on the silicon oxide layer 16 for patterning, thereby providing an etching mask. Though the opening of the mask pattern is originally designed to have the same width as that of the first interconnection 13, FIG. 2D illustrates the case where the opening of said mask pattern slightly extends outward from the surface of said first interconnection 13 due to the mismatching of the mask pattern.

Figure 1:
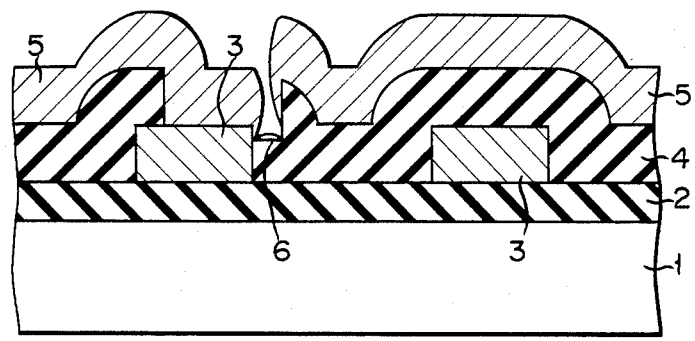
FIG. 1 is a sectional view of the conventional semiconductor device provided with multilayer interconnection.
Figure 2E:
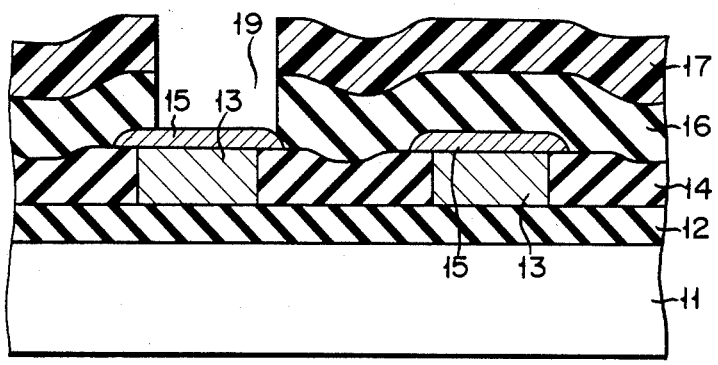

Thereafter, as illustrated in FIG. 2E, that portion of the silicon oxide layer 16 which lies on the aforementioned mask pattern opening is etched, until the surface of the underlying tungsten layer 15 is exposed, by the RIE process involving the application of a gaseous mixture consisting of, for example, CF$_4$ and H$_2$ with the photoresist 17 used as a mask. This etching is carried out under the following conditions, for example:

CF$_4$ flow rate: 24 cc/min
H$_2$ flow rate: 10 cc/min
Gas pressure: 1.33 Pa
High frequency power: 150 W In this case, the silicon oxide layer is etched at the rate of less than 400 Å/min, whereas the tungsten layer 15 is etched at a far smaller rate of less than 10 Å/min. Consequently, after the surface of the tungsten layer 15 is exposed, etching is not practically advanced. Even though, the aforesaid mask pattern opening somewhat extends outward from the surface of the first interconnection 13, the present of the broader tungsten layer 15 causes the hole 19 to be formed only in said tungsten layer 15, as shown in FIG. 2E. Therefore, a narrow deep groove 6 is not formed as shown in FIG. 1 representing the conventional method of forming multilayer interconnection for a semiconductor device.

Figure 2F:
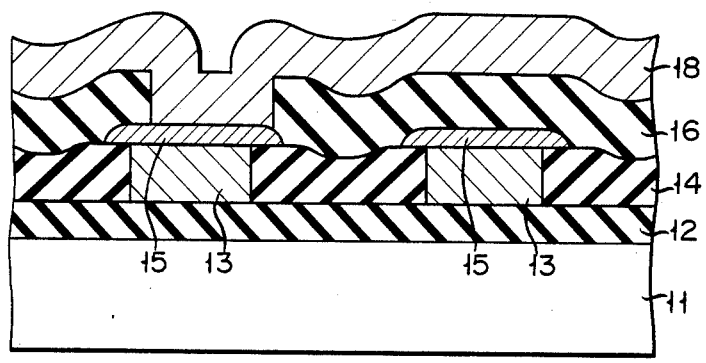

After the photoresist 17 is removed, a second interconnection is formed as shown in FIG. 2F. This second interconnection 18 is constructed by the steps of depositing on aluminium layer with a thickness of less than 1 micron by, for example, the magnetron sputtering process, providing an etching mask in said aluminium layer and patterning said etching mask by the RIE process involving the application of a gaseous mixture consisting of, for example, CCl$_4$ and Cl$_2$.

As seen from FIG. 2F, the second interconnection 18 formed as described above very effectively covers the connection port 19 facing the first interconnection 13, thereby eliminating the breakage of disconnection of these interconnections 13, 18 and elevating the reliability of a semiconductor element.

The foregoing embodiment refers to the case where the silicon nitride layer was flattened by the RIE process to form a second insulation layer in such a manner that the grooves in the first interconnection were filled up and the upper portion of said first interconnection was exposed. However, any other etching process may be applied for the flattening of said silicon nitride layer. For instance, the flattening of said silicon nitride layer can be effected, for example, by applying an organic layer prepared from a resist, organosilicate glass or high polymer resin on the whole of an insulation layer, flattening the surface of said insulation layer and etching said surface by such a process as enables both insulation layer and organic layer to be etched substantially at the same rate. Or, it is possible to provide a second insulation layer from a fluidized high polymer polyimide resin layer or silicon oxide layer deposited by the RF bias sputtering process, etching the whose surface of an insulation layer formed on the flattened portion of said silicon oxide layer, thereby exposing the surface of the first interconnection pattern.

The aforementioned embodiment refers to the case where the process of forming the first interconnection pattern was carried out by two steps so as to cover both lateral edges of an insulation layer lying in said first interconnection pattern with a width of, for example, 0.1 to 0.2 micron. However, said process may be performed by a single step. Description may now be made with reference to FIGS. 3A to 3F of the single step formation of said first interconnection pattern.

Figure 3A:
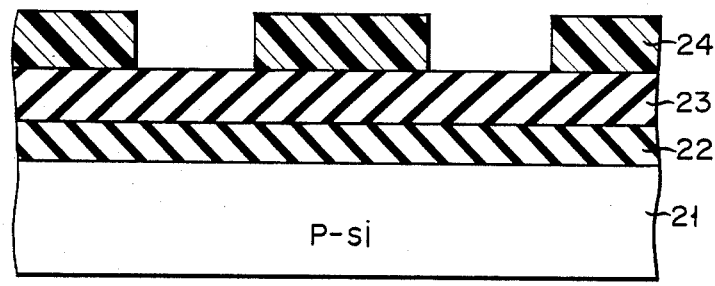
FIGS. 3A to 3F are sectional views illustrating the sequential steps of forming multilayer interconnection for a semiconductor device according to a second embodiment of the invention.

As seen from FIG. 3A, a SiO$_2$ layer 22 is deposited by the vapor phase growth process as a first insulation layer with a thickness of 0.7 μm microns on a silicon substrate 21 on which a semiconductor element is previously formed. Further, a SiO$_2$ layer 23 is deposited as a second insulation layer with a thickness of 0.8 micron on said first insulation layer 22. Later, a resist mask 24 bearing windows at the regions where said first interconnection is to be formed is deposited by the known PEP process.

Figure 3B:
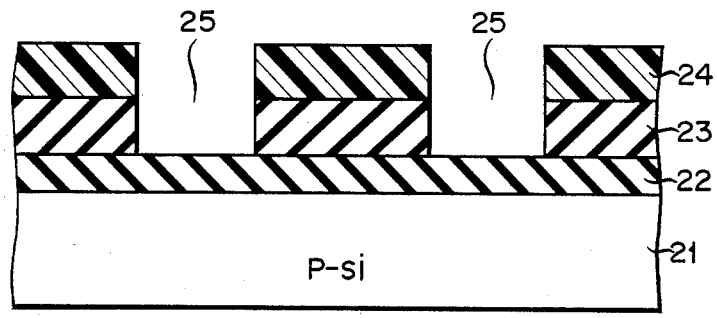

Next, as illustrated in FIG. 3B, a second insulation layer 23 prepared from SiO$_2$ is etched by the RIE process involving the application of a gaseous mixture consisting of, for example, CF$_4$ and H$_2$, thereby forming a groove or hole 25 along the regions where the first interconnection is to be formed.

Figure 3C:
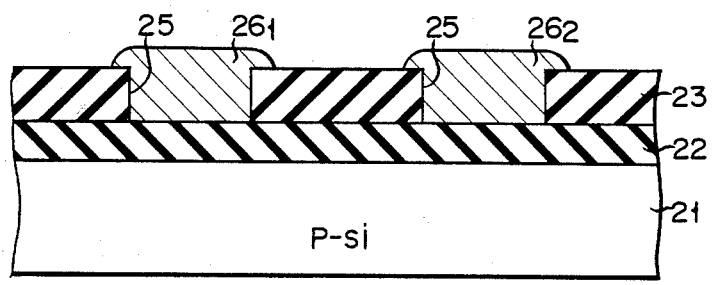

After the resist mask 24 is removed, a tungsten layer is embedded in said groove or hole 25 with a greater thickness than the depth thereof (for example, about 1 micron) by the vapor phase growth process involving the application of a gaseous mixture consisting of, for example, WF$_6$ (tungsten hexafluoride) and H$_2$, thereby providing first interconnections 26$_1$, 26$_2$. As shown in FIG. 3C, therefore, the upper portions of the first interconnections 26$_1$, 26$_2$ are formed wider than the corresponding grooves or holes 25 to cover the edges of the SiO$_2$ layer 23. In this case, it is preferred that the tungsten layer be deposited under the following conditions:

Substrate temperature: 250° to 500° C.
Reactor pressure: $1 \times 10^{-3}$ to 760 Torr
Partial pressure of WF$_6$ gas: $1 \times 10^{-4}$ to $5 \times 10^{-2}$ Torr The selective growth of the tungsten layer only in the groove or hole 25 of the SiO$_2$ layer is assumed to arise from the fact that the surface of the bottom of said groove or hole 25 is activated by etching.

Figure 4:
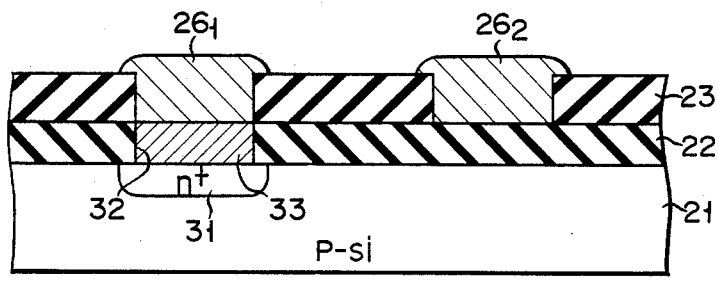
FIG. 4 is a sectional view of a first interconnection contacted with a semiconductor substrate.

That portion of the substrate 21 which is contacted by the first interconnection 26$_1$ has a section indicated in, for example, FIG. 4. Namely, before the SiO$_2$ layer 23 is superposed on the SiO$_2$ layer 22, a hole 32 is formed in the SiO$_2$ layer to face the substrate 21, and a tungsten layer 33 is embedded in said hole 32 by the selective vapor phase deposition process. As a result, the first interconnection 26$_1$ is brought into contact by means of the tungsten layer 33 with a semiconductor element, for example, an n+ diffusion layer 31.

Figure 3D:
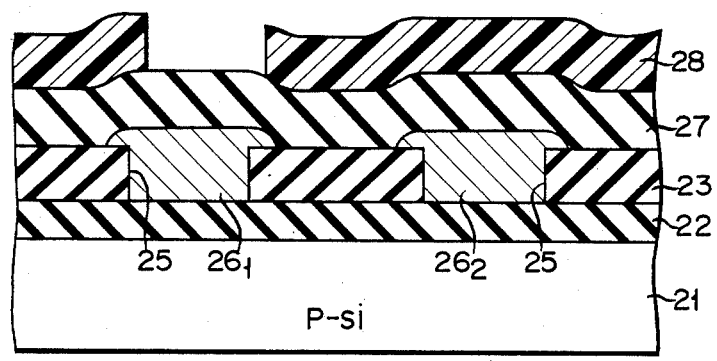

Thereafter, as illustrated in FIG. 3D, an SiO$_2$ layer 27 is deposited on said first interconnection 26$_1$ as a third insulation layer with a thickness of about 0.8 micron by the plasma vapor phase growth process involving the application of a gas mixture consisting of, for example $SiH_4$ and $N_2$. Thereafter, a resist mask 28 provided with a window intended for the formation of a hole is deposited by the PEP process on said $SiO_2$ layer 27. The window of said resist mask 28 has the same width as that of the lower portion of the first interconnection $26_1$, namely, the corresponding groove or hole 25. However, FIG. 3D represents the case where the window of the resist mask 28 is slightly displaced from its prescribed position due to the mismatching of its pattern.

Figure 3E:
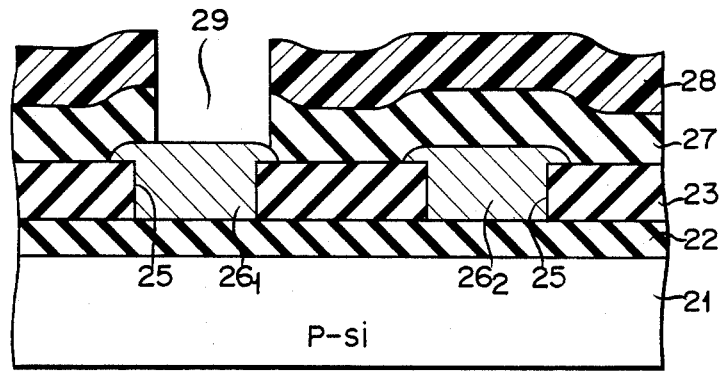

Thereafter as shown in FIG. 3E, the $SiO_2$ layer 27 is selectively etched by the RIE process involving the application of a gaseous mixture consisting of, for example, $CF_4$ and $H_2$, thereby forming a connection port 29 facing the first interconnection 26. Said etching is performed; for example, under the following conditions:

$CF_4$ flow rate: 24 cc/min
$H_2$ flow rate: 10 cc/min
Gas pressure: 1.33 pa
High frequency power: 150 W In the above-mentioned etching process, the $SiO_2$ layer 27 is etched at the rate of less than 400 Å/min, whereas the first interconnection 26 formed of the tungsten layer is etched at a slow rate of less than 10 Å/min. If, therefore, the etching is carried out under the above-mentioned condition, particularly no progress appears in the etching after the surface of the first interconnection 26 is exposed. Even if the resist opening slightly extends outward from the surface of the first interconnection 26, the hole 29 is formed only on the first interconnection $26_1$ as shown in FIG. 3E, because the head portion of said first interconnection 26, is made sufficiently broad to cover both edges of the $SiO_2$ layer to a slight extent (for example, 0.1 to 0.2 micron). Consequently, a narrow deep groove 6 shown in FIG. 1 repressing the conventional multilayer wiring-manufacturing method for a semiconductor device is not produced.

Figure 3F:
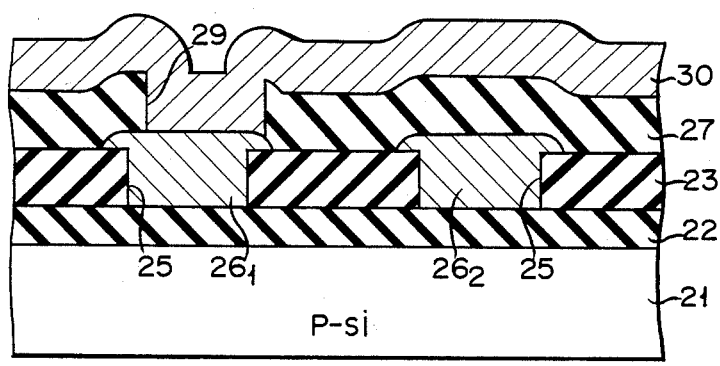

After the subsequent removal of the resist mask 28 a second interconnection 30 is formed to be brought into contact with the first interconnection $26_1$ by means of the hole 29 an indicated in FIG. 3F. Said second interconnection 30 is formed by first depositing an aluminium interconnection with a thickness of about 1 micron, for example, by the magnetron sputtering process and patterning said aluminium interconnection 30 by the RIE process involving the application of a gas mixture consisting of, for example, $CCl_4$ and $Cl_2$.

As seen from FIG. 3F, the second interconnection 30 formed as described above very effectively covers the hole 29 formed to face the first interconnection $26_1$. Should the hole 29 be displaced from its prescribed position by mismatching, the present invention prevents a narrow deep groove from being formed due to overetching as was observed in the conventional method of forming multilayer interconnection for a semiconductor device. Consequently, the breakage or disconnection of the second wire 30 is reliably avoided, thereby noticeably elevating the reliability of a semiconductor device provided with multilayer interconnection.

In the foregoing embodiment, the groove or hole 25 shown in FIG. 3B was etched by the RIE process, and simultaneously the bottom surface of said groove or hole 25 was activated. This activation desired for the subsequent selective vapor phase growth of the tungsten layer 33 may be carried out by any other process, for example, sputtering, chemical dry etching (CDE) or wet etching involving the application of an acid or base. SAid activation may be performed independently of etching, namely, by irradiation of electrons or laser beams.

The foregoing examples described with reference to FIGS. 2 and 3 refer to the case where the first wire was formed by the vapor phase growth of a tungsten layer by application of a gas mixture of $WF_6$. However, it is possible to apply another gas mixture of $WCl_6$. Further, it is possible to prepare the first wire by the vapor phase growth of the fluoride or chloride of any other high melting metal such as molybdenum (Mo), niobium (Nb), tantalum (Ta) or titanium (Ti). Further, the same result is attained by the vapor phase growth of a high melting metal silicide based on the application of a gas mixture consisting of a gas of any of the above-mentioned metal compounds and, for example, $SiH_4$ or $SiH_2Cl_2$.

In the foregoing examples, the first or second interconnection was formed by depositing an aluminium layer by sputtering. Instead, the first or second interconnection may be formed by depositing a layer of molybdenum, tungsten, platinum or silicide thereof similarly by sputtering. It will be noted that this invention is effectively applicable also when the first or second interconnection is formed by a laminated layer of the above-mentioned metals or silicides thereof.

The foregoing examples refer to the case where two-layer interconnection was provided. However, the present invention attains the same result even when 3 or more layers of interconnection are provided.

What is claimed is:

1. A method of forming multilayer interconnections for a semiconductor device which comprises the steps of:
   (i) forming a first insulation layer on a substrate having semiconductor elements;
   (iia) forming a second insulation layer provided with grooves or holes therein on said first insulation layer;
   (ii) forming first interconnection patterns in said grooves or holes by means of a selective vapor phase growth process using a gas of a metal compound in such a manner that said first interconnection patterns cover edge parts of said second insulation layer neighboring said grooves or holes of said second insulation layer, such that the width of the edge-covering portions of said first interconnection pattern is broader than corresponding said grooves or holes,
   (iii) forming a third insulation layer at least on the first interconnection patterns;
   (iv) forming a hole in said third insulation layer to expose part of said first interconnection patterns; and
   (v) forming second interconnection patterns so as to be brought into contact with said first interconnection patterns through said hole, the second interconnection patterns overlapping the first interconnection patterns.

2. A method of forming multilayer interconnections for a semiconductor device which comprises the steps of:
   (i) forming a first insulation layer on a substrate having semiconductor elements;
   (iia) forming a first interconnection pattern on said first insulation layer;

(iib) forming a second insulation layer on a whole surface including said first interconnection pattern;

(iic) forming a layer of another insulation material on said second insulation layer;

(iid) etching said another insulation material and said second insulation layer until an upper surface of said first interconnection pattern is exposed, in flush with a neighboring etched surface of said second insulation layer;

(iie) depositing a metal layer or metal silicide layer on said exposed surface of said first interconnection pattern by means of a selective vapor phase growth process using a gas of a metal compound, so that the width of said metal layer or metal silicide layer is such that it covers neighboring parts of said second insulation layer;

(iii) forming a third insulation layer at least on the resultant said metal layer or metal silicide layer;

(iv) forming a hole in said third insulation layer to expose part of said metal layer or metal silicide layer; and (v) forming a second interconnection pattern so as to be brought into contact with said metal layer or metal silicide layer through said hole, the second interconnection pattern overlapping the first interconnection pattern.

3. The method according to claim 2, wherein said first interconnection layer is formed of aluminum; said step (iib) comprises a process of depositing a silicon oxide layer by a vapor growth method on the whole surface including the aluminum interconnection said another insulation material in said step (iic) is silicon nitride; and said etching is conducted by a reactive ion etching process involving an application of a gas mixture consisting of $CF_4$ and $H_2$.

4. The method according to claim 2, wherein said another insulation material is selected from the group consisting of a resist, organosilicate glass and high polymer resin.

5. A method of forming interconnections for a semiconductor device which comprises the steps of:

(i) forming a first insulation layer on a substrate having semiconductor elements;

(iia) forming a second insulation layer on said first insulation layer;

(iib) selectively etching said second insulation layer, thereby forming a groove or hole in the etched region of said second insulation layer to expose an activated surface of said first insulation layer;

(iic) performing a selective vapor phase growth of an electrically conductive material comprising a metal to selectively grow said conductive material on said activated surface of said first insulation layer to a thickness slightly greater than a depth of said groove or hole, so that said metal thus grown covers neighboring edge parts of said second insulation layer such that the width of said conductive material is broader than said groove or hole, thereby forming a first interconnection pattern;

(iii) forming a third insulation layer at least on the first interconnection pattern;

(iv) forming a hole in said third insulation layer to expose part of said first interconnection pattern; and (v) forming a second interconnection pattern so as to be brought into contact with said first interconnection pattern through said hole, the second interconnection pattern overlapping the first interconnection pattern.

6. The method according to any one of claims 1, 2 or 5 wherein said metal is one selected from the group consisting of tungsten, molybdenum, niobium, tantalum and titanium.

7. The method according to claim 5, wherein the vapor of said vapor phase growth process comprises a gas consisting of the fluoride or chloride of a high melting metal selected from the group consisting of tungsten, molybdenum, niobium, tantalum, titanium, and mixtures thereof.

8. The method according to claim 5, wherein the vapor of the vapor phase growth process comprises a gaseous mixture consisting of the fluoride or chloride of a high melting metal selected from the group consisting of tungsten, molybdenum, niobium, tantalum, titanium, and mixtures thereof together with a silicon-containing compound.

9. The method according to claim 5, wherein the surface of the bottom of said groove further is activated prior to the step of forming said first interconnection pattern.

10. The method according to claim 5, wherein the second insulation layer is selectively etched by the reactive ion etching process to provide said groove or hole.

11. The method according to claim 9, wherein said activation of the surface of the bottom of the groove is carried out by the irradiation of electrons.

12. The method according to claim 9, wherein said activation of the surface of the bottom of the groove is effected by the irradiation of laser beams.

* * * * *